(12) United States Patent
Krause

(10) Patent No.: US 12,456,972 B2
(45) Date of Patent: Oct. 28, 2025

(54) CIRCUIT ASSEMBLY FOR LIMITING THE GATE CURRENT AT A FIELD-EFFECT TRANSISTOR

(71) Applicant: FERDINAND-BRAUN-INSTITUT GGMBH LEIBNIZ-INSTITUT FÜR HÖCHSTFREQUENZTECHNIK, Berlin (DE)

(72) Inventor: Sascha Krause, Berlin (DE)

(73) Assignee: FERDINAND-BRAUN-INSTITUT GGMBH LEIBNIZ-INSTITUT FÜR HÖCHSTFREQUENZTECHNIK, Berlin (DE)

(*) Notice: Subject to any disclaimer, the term of this patent is extended or adjusted under 35 U.S.C. 154(b) by 481 days.

(21) Appl. No.: 17/998,410

(22) PCT Filed: May 5, 2021

(86) PCT No.: PCT/EP2021/061843
§ 371 (c)(1),
(2) Date: Nov. 10, 2022

(87) PCT Pub. No.: WO2021/228652
PCT Pub. Date: Nov. 18, 2021

(65) Prior Publication Data
US 2023/0308087 A1    Sep. 28, 2023

(30) Foreign Application Priority Data
May 13, 2020    (DE) ............ 10 2020 112 980.7

(51) Int. Cl.
*H03F 1/30*      (2006.01)
*H03F 3/193*     (2006.01)
*H03K 17/0812*   (2006.01)

(52) U.S. Cl.
CPC ....... *H03K 17/08122* (2013.01); *H03F 3/193* (2013.01); *H03F 2200/18* (2013.01); *H03F 2200/294* (2013.01); *H03F 2200/451* (2013.01)

(58) Field of Classification Search
CPC ............. H03F 1/30; H03F 3/20; H03G 3/30
(Continued)

(56) References Cited

U.S. PATENT DOCUMENTS

2016/0380600 A1    12/2016  Diduck

FOREIGN PATENT DOCUMENTS

| GB | 2165114 A     | 4/1986 |
| WO | 2006036060 A1 | 4/2006 |
| WO | 2017027346    | 2/2017 |

OTHER PUBLICATIONS

International Search Report mailed Jul. 22, 2022, in connection with PCT International Application No. PCT/EP2021/061843.
(Continued)

*Primary Examiner* — Henry Choe
(74) *Attorney, Agent, or Firm* — Norris McLaughlin, PA

(57) ABSTRACT

A circuit arrangement for limiting the gate current at a field effect transistor, FET, comprises a first FET and a DC supply network connected to a gate terminal of the first FET; wherein the supply network provides a voltage Vgg to the gate terminal of the first FET via a first connection comprising a high impedance resistor R1 and a second FET connected in series therewith and having a gate terminal; the second FET having an ON state at a gate-source voltage of 0 V and having its gate terminal also connected to the gate terminal of the first FET via a second connection in parallel with the resistor R1; wherein a voltage drop occurring across the resistor R1 results in increasing blocking of the second FET.

8 Claims, 3 Drawing Sheets

(58) Field of Classification Search
USPC .................................................. 330/296, 285
See application file for complete search history.

(56) References Cited

OTHER PUBLICATIONS

English translation of International Search Report mailed Jul. 22, 2022, in connection with PCT International Application No. PCT/EP2021/061843.
Written Opinion issued in connection with PCT International Application No. PCT/EP2021/061843.
Delias et al., "A GaN-Based Supply Modulator for Energy Efficiency Enhancement of Active Phased-Array Antennas", Xlim UMR CNRS 7252, 2014.

CIRCUIT ASSEMBLY FOR LIMITING THE GATE CURRENT AT A FIELD-EFFECT TRANSISTOR

This application is the U.S. National Stage of International Application No. PCT/EP2021/061843, filed May 5, 2021, which claims foreign priority benefit under 35 U.S.C. § 119 of German Patent Application No. 10 2020 112 980.7, filed May 13, 2020, the disclosures of which are incorporated herein by reference.

The present invention relates to a circuit arrangement for limiting the gate current on a field effect transistor, and in particular a circuit arrangement for limiting the gate current on a GaN or GaAs RF power HEMT in an analog amplifier circuit.

STATE OF THE ART

The development of electronics that can deliver both higher frequencies and power at smaller dimensions is a challenge, especially in the microwave range, due to the applicable laws of physics. At the same time, higher transmission frequencies in communications technology enable higher bandwidths and faster data transmission (e.g. 5G) as well as finer temporal and spatial resolution for radar applications in both civilian and military areas of operation. A significant contribution to the current state of the art is owed to the High Electron Mobility Transistor (HEMT), which is also known as Heterojunction Field-Effect Transistor (HFET), Two-Dimensional Electron-Gas Field-Effect Transistor (TEGFET), Modulation-Doped Field-Effect Transistor (MODFET) or abbreviated simply as Field Effect Transistor (FET). This special field-effect transistor uses two heterogeneous semiconductor materials with different band gaps to provide a quasi two-dimensional channel filled with electrons at the boundary layer. In this undoped region, also known as 2-DEG ("two dimensional electron gas"), high electron mobilities can be achieved, which makes the high achievable operating frequencies of this technology possible.

The most widely used HEMT is based on gallium arsenide (GaAs) technology, which is, however, being replaced in many areas by the maturing gallium nitride (GaN) technology. Due to the higher bandgap and current-carrying capacity in GaN, significantly higher power levels can be achieved without significant drawbacks in other electrical parameters such as noise figure. This allows transceivers consisting of a low-power, low-noise amplifier ("LNA") to be monolithically integrated on a single chip, thus saving costs and reducing component complexity and dimensions.

In general, a low-noise amplifier is optimized to amplify weak RF signals (signals in the high-frequency range (HF) from 9 kHz to about 30 GHz) with as little noise as possible. However, large power levels may well occur at the input even at frequencies outside the actual receive frequency, e.g. due to unwanted coupling, reflections from the power amplifier or strong interference signals (jammers). These can have a temporary or permanent negative effect on the functionality of the receiver.

To protect the sensitive and important component, conventional GaAs LNA use limiter diodes (diodes, Zener diodes) as limiting switches at the input, but these cannot be monolithically integrated and require a second chip. GaN HEMTs, on the other hand, do not necessarily rely on external limiting circuits, as they can tolerate much higher power levels due to their high breakdown voltage. These are usually in the range of 10 W. However, values up to 30 W can also be achieved if a high-impedance resistor is used at the gate (M. Rudolph et al., "Robust Stacked GaN-Based Low-Noise Amplifier MMIC for Receiver Applications," IEEE Trans. Microwave Theory Tech. vol. 1, no. 55, pp. 37-43, January 2007). In the overload case, the gate current is limited by this series resistor, but the voltage drop that occurs across it causes the transistor's operating point to shift to low class C operation while negative gate voltages increase.

However, at high input powers, the voltage amplitudes at the input of the transistor are so large that a gate leakage current occurs. This gate current has a particularly detrimental effect on the robustness or lifetime of the transistor (M. Broasa et al. "Correlation of gate leakage and strain distribution in GaN/AlGaN HEMT structures", in 27th European Symposium on Reliability of Electron Devices, failure physics and analysis (ESREF), Halle (Saale), Germany, 2016). The flow current is usually reduced by the said high-impedance resistor in the gate supply network.

The voltage dropped across the resistor by the flowing current is polarized in such a way that more negative voltages are produced at the gate, which in turn drive the transistor further into pinch-off and thus protect it from high gate currents at the expense of increased negative reverse voltages (GB 2 165 114 A). However, this method does not allow the gate current to be fully controlled, only reduced. With increasing input powers, the forward current at the gate thus continues to increase.

DISCLOSURE OF THE INVENTION

It is therefore an object of the present invention to provide a circuit arrangement for limiting the gate current at a field-effect transistor, with the aid of which the forward current is effectively limited in the input-side overload case. In particular, even at very high input powers, the forward current at the gate should be limited and not increase further.

These tasks are solved according to the invention by the features of patent claim 1. Expedient embodiments of the invention are contained in the respective sub claims. Furthermore, based thereon, an amplifier circuit and an apparatus for receiving microwave signals are proposed. A circuit arrangement according to the invention for limiting the gate current on a field effect transistor, FET, comprises a first FET and a DC supply network connected to a gate terminal of the first FET; wherein the supply network provides a voltage $V_{gg}$ (gate voltage, also referred to as gate AN voltage, auxiliary voltage or gate bias voltage) at the gate terminal of the first FET via a first connection comprising a high impedance resistor $R_1$ and a second FET connected in series therewith and having a gate terminal; the second FET having an ON state at of a gate source voltage of 0 V and having its gate terminal connected to the gate terminal of the first FET via a second connection in parallel with the resistor $R_1$ also; wherein a voltage drop occurring at the resistor $R_1$ results in an increasing blocking of the second FET.

In particular, resistors with several thousand ohms are considered to have a high resistance. Preferably, the resistor $R_1$ has between 1 kΩ and 10 MΩ, more preferably between 1 kΩ and 1 MΩ, more preferably between 1 kΩ and 100 kΩ, more preferably between 1 kΩ and 10 kΩ, and even more preferably between 5 kΩ and 10 kΩ. In this context, smaller high-impedance resistors in the supply network allow for shorter discharge or charge times (time constants) and thus contribute to a faster recovery of the first transistor after an overload scenario (the original bias of the supply point is restored faster). In principle, any type of field-effect transistor with an ON state at a gate-source voltage of 0 V is suitable for the proposed circuitry. Preferably, the first junction and the second junction are connected to the gate terminal of the first FET without any further switching elements. In sections, the first connection and the second connection can also be implemented as a common connection. In this context, a connection is understood to mean, in particular, an electrical conductor track or, in general, an electrical conductor or a line for connecting electronic components. Preferably, the connection of the supply network to the gate terminal of the first FET does not comprise any elements other than those designated in this application as being according to the invention. Preferably, the first FET is based on GaN technology, which, due to the higher bandgap and an associated high reverse voltage as well as the higher current-carrying capacity, can achieve considerably higher performances without having any significant disadvantages in other electrical parameters such as the noise figure. Particularly preferably, the FET is a HEMT. A circuit arrangement according to the invention is particularly suitable for constructing an analog LNA amplifier circuit with high input powers.

The invention thus describes a modification in the DC supply network of an FET with the aid of which the forward current in the input-side overload case is effectively limited by a current-dependent adaptive resistance control. In this case, the limiting circuit essentially consists of the second FET (normal-AN, depletion type) and the first resistor $R_1$. The value of the resistor $R_1$, together with the threshold voltage of the second FET, determines the effectiveness of the circuit. A higher resistance leads to a stronger overcurrent suppression, but the time constant of the supply network is lowered.

This is a simple feedback loop. However, the existing gate resistor is not used as a current limiter as usual, but a control voltage is generated via the falling voltage when the gate current flows, which in turn increasingly blocks the second FET in series (depletion mode, normal-AN). This can be compared to a variable resistor in the supply network, whose value increases steadily with increasing gate current and thus represents an effective limitation of the current, which is then largely independent of the RF input power applied to the first FET.

In comparison, this arrangement has no negative effect on the small-signal behavior, the noise figure of an amplifier built with it, nor on the blocking voltages that occur. Simulations illustrate that, with constant resistor values, a current reduction of about 20 times is possible for high input powers (44 dBm) and the current is effectively limited, the level of which is determined by the selected resistance value of the first resistor $R_1$ and the threshold voltage of the second FET. With a constant protection behavior, it is also possible to choose a lower resistance, which reduces the time constant of the supply network, and thus shorter recovery times of an LNA after an overload scenario can also be achieved.

Another advantage over limiting circuits for the gate current based on diodes for analog amplifiers is that the highest tolerable gate current can be freely selected and is determined from the resistance value of the first resistor $R_1$ and the pinch-off voltage of the second FET. A circuit arrangement according to the invention is largely independent of the design of the second FET used. The second FET only has to be able to tolerate reverse voltages between drain and source, which also occur with the conventional method at the resistor in the supply network.

Preferably, a second high impedance resistor $R_2$ is connected in parallel with the high impedance resistor $R_1$ for RF decoupling in the second connection. Preferably, the resistor $R_2$ has between 1 kΩ and 10 MΩ, more preferably between 1 kΩ and 1 MΩ, more preferably between 1 kΩ and 100 kΩ, and even more preferably between 1 kΩ and 10 kΩ.

Preferably, for RF decoupling, the first connection and the second connection are connected to the gate terminal of the first FET via a common inductance L (as a choke). In this context, a connection via a common inductance means that, at least in one section, the first connection and the second connection are also implemented as a common connection, with this section having an inductance L or comprising an inductive element with an inductance value L. The inductance L is understood as an element of the supply network. In an amplifier circuit, its magnitude depends, for example, on the operating frequency of the amplifier. Preferably, the inductance L has between 1 nH and 10 mH, more preferably between 10 nH and 1 mH and even more preferably between 10 nH and 100 µH.

Preferably, the first FET is a GaN or GaAs RF power HEMT. GaN HEMT technology stands out as a robust technology for the RF power range due to its large bandgap and consequently high breakdown voltage, but flow currents that occur at high input powers have proven to be particularly detrimental to its lifetime. A circuit arrangement according to the invention, on the other hand, is able to effectively limit this current. In addition, the small-signal and noise behavior is not affected, so that particularly robust and interference-insensitive LNAs for the high-power range in particular can be realized with it. However, a first FET based on GaAs HEMT technology can also be used with slight restrictions in a circuit arrangement according to the invention.

Preferably, the first FET and the second FET are monolithically integrated on one chip. This allows particularly compact and robust LNAs to be realized and their frequency bandwidth to be increased. Furthermore, the production of LNAs can be simplified and their assembly costs reduced.

Alternatively, however, the first FET and the second FET can be located on different chips. Although this generally means higher assembly costs and losses, such a hybrid approach can achieve greater flexibility in the tuning of the individual circuit elements.

Preferably, the circuit arrangement does not include diodes or Zener diodes to limit the gate current at the first FET. These are commonly used in LNA as limiter diodes at the input to protect the sensitive and important component. However, these cannot be integrated monolithically and require a second chip.

Another aspect of the invention relates to an amplifier circuit, comprising a circuit arrangement according to any of claims 1 to 7, wherein an input power P in to be amplified is fed into the first FET via a third connection connected to the gate terminal of the first FET. This may in particular be an analog LNA amplifier circuit.

Still another aspect of the invention relates to a device for receiving microwave signals, comprising an amplifier circuit according to claim 8. These microwave signals may in particular be signals for data transmission (e.g. 5G) or for radar applications in both civil and military applications.

Further preferred embodiments of the invention result from the features mentioned in the subclaims.

The various embodiments of the invention mentioned in this application can be advantageously combined with each other, unless otherwise specified in the individual case.

BRIEF DESCRIPTION OF THE DRAWINGS

The invention is explained below in embodiment examples with reference to the accompanying drawing. It shows.

DETAILED DESCRIPTION OF THE DRAWINGS

Figure 1:
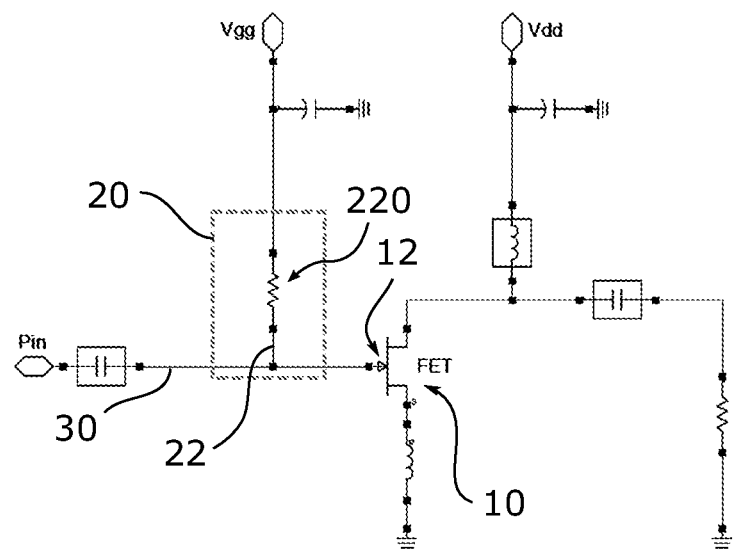
FIG. 1 a schematic representation of a conventional circuit arrangement for limiting the gate current in an amplifier circuit, FIG. 2 a schematic representation of a first embodiment of a circuit arrangement according to the invention for limiting the gate current in an amplifier circuit, FIG. 3 a schematic representation of a second embodiment of a circuit arrangement according to the invention for limiting the gate current in an amplifier circuit, FIG. 4 a schematic representation of a third embodiment of a circuit arrangement according to the invention for limiting the gate current in an amplifier circuit, and FIG. 5 various characteristic curves for comparing a conventional current limiter circuit and a current limiter circuit according to the invention.

FIG. 1 shows a schematic diagram of a conventional circuit arrangement for limiting the gate current in an amplifier circuit. This comprises a FET 10 to be limited in its gate current and a DC supply network 20 connected to a gate terminal 12 of the FET 10; the supply network 20 providing a voltage $V_{gg}$ at the gate terminal 12 of the FET 10 via a connection 22 which comprises a high-impedance resistor R 220; a voltage drop occurring at the resistor R 220 leading to an increasing reduction in the gate current at the FET 10. In the exemplary amplifier circuit shown, an input power $P_{in}$ to be amplified is supplied to the first FET 10 via a third connection 30 connected to the gate terminal 12 of the first FET 10.

However, at high input powers P in, the voltage amplitudes at the input of the FET 10 are so large that a forward current occurs at the gate terminal 12. This is particularly detrimental to the robustness or lifetime of the FET 10 and is reduced by the high resistance R 220 in the supply network 20. The voltage dropped across resistor R 220 by the flowing current is thereby poled to produce more negative voltages at gate terminal 12, which in turn drive FET 10 further into pinch-off, thereby protecting it from high gate currents at the expense of increased negative reverse voltages. However, this method does not allow the gate current to be controlled, only reduced. Thus, as input powers $P_{in}$ increase, the forward current at gate terminal 12 continues to increase.

Figure 2:
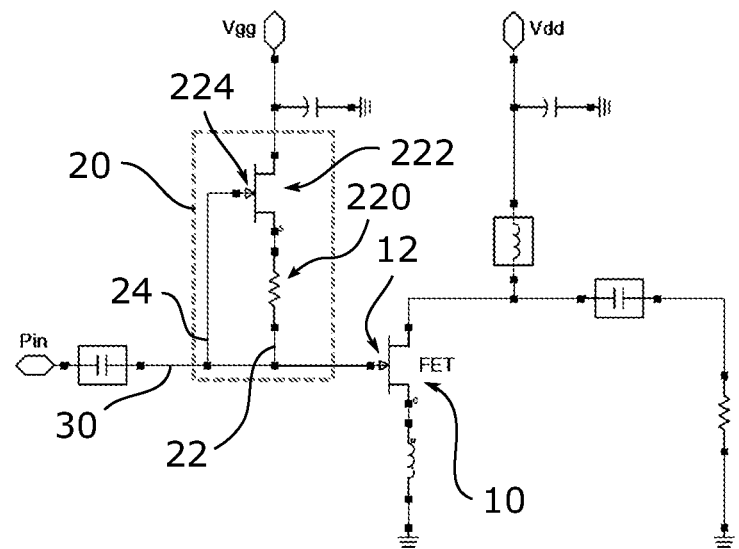

FIG. 2 shows a schematic representation of a first embodiment of a circuit arrangement according to the invention for limiting the gate current in an amplifier circuit. This comprises a first FET 10 to be limited in its gate current and a DC supply network 20 connected to a gate terminal 12 of the first FET 10; wherein the supply network 20 provides a voltage $V_{gg}$ at the gate terminal 12 of the first FET 10 via a first connection 22, which comprises a high-impedance resistor $R_1$ 220 and a second FET 222 connected in series therewith and having a gate terminal 224; the second FET 222 having an ON state at a gate-source voltage of 0 V and having its gate terminal 224 connected to the gate terminal 12 of the first FET 10 via a second connection 24 in parallel with the resistor $R_1$ 220 also; wherein a voltage drop occurring across the resistor $R_1$ 220 results in increasing blocking of the second FET 222. In the exemplary amplifier circuit shown in accordance with the invention, an input power $P_{in}$ to be amplified is fed into the first FET 10 via a third connection 30, which is connected to the gate terminal 12 of the first FET 10.

A control voltage is generated via the voltage dropping across the first resistor $R_1$ 220 when the gate current flows, which increasingly blocks the FET (depletion mode, normal-AN) connected in series. This can be compared to a variable resistor in the supply network, the value of which increases steadily as the gate current increases, thus providing an effective limit to the current, which is largely independent of the applied input power $P_{in}$. In particular, the first FET 10 may be a GaN RF power HEMT, and the first FET 10 and the second FET 222 may be monolithically integrated on a single chip.

Figure 3:
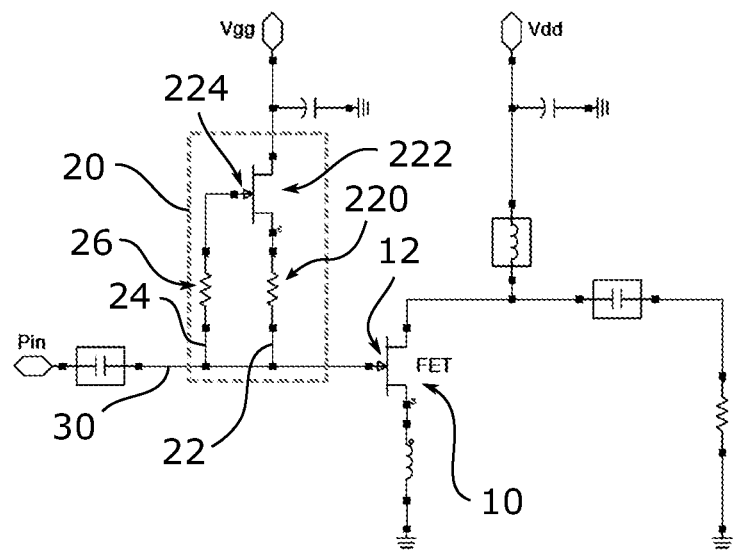

FIG. 3 shows a schematic representation of a second embodiment of a circuit arrangement for limiting the gate current according to the invention. The basic circuit structure corresponds to the embodiment shown in FIG. 2. Therefore, the reference signs and their respective assignment to the individual features apply accordingly. However, for RF decoupling, a second high-impedance resistor $R_2$ 240 is connected in parallel with the high-impedance resistor $R_1$ 220 in the second connection 24. Thus, according to the invention, RF decoupling in limiting the gate current takes place via two high-impedance resistors $R_1$ 220 and $R_2$ 240, whereby a voltage is dropped at the resistor $R_1$ 220 connected in series with the second FET 222, which increasingly blocks the second FET 222 and thereby limits the gate current of the first FET 10.

Figure 4:
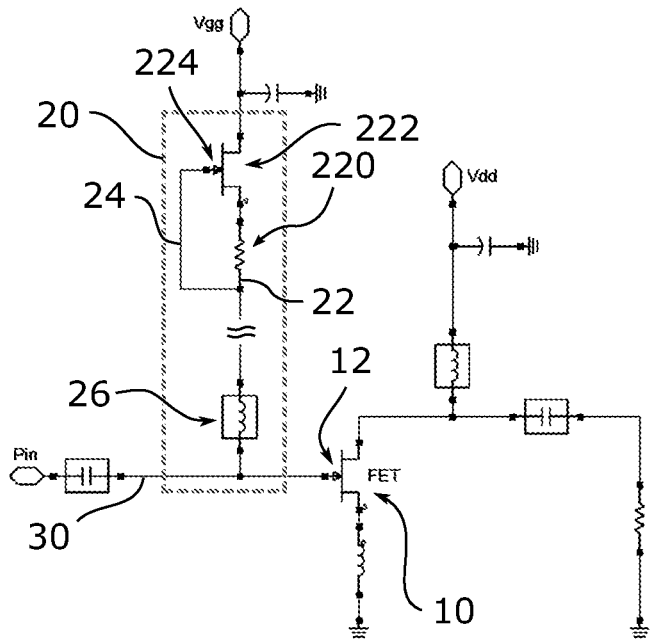

FIG. 4 shows a schematic representation of a third embodiment of a circuit arrangement for limiting the gate current according to the invention. The basic circuit structure corresponds to the embodiment shown in FIG. 2. Therefore, the reference signs and their respective assignment to the individual features apply accordingly. However, for RF decoupling, the first connection 22 and the second connection 24 are connected to the gate terminal of the first FET 10 via a common inductor L 26. Thus, according to the invention, RF decoupling when limiting the gate current is performed via an inductance L connected to the gate terminal 12 of the first FET 10. The resistor $R_1$ is used here only to generate a negative reverse voltage at the gate source of the second FET 222 located in the supply network 20.

Figure 5:
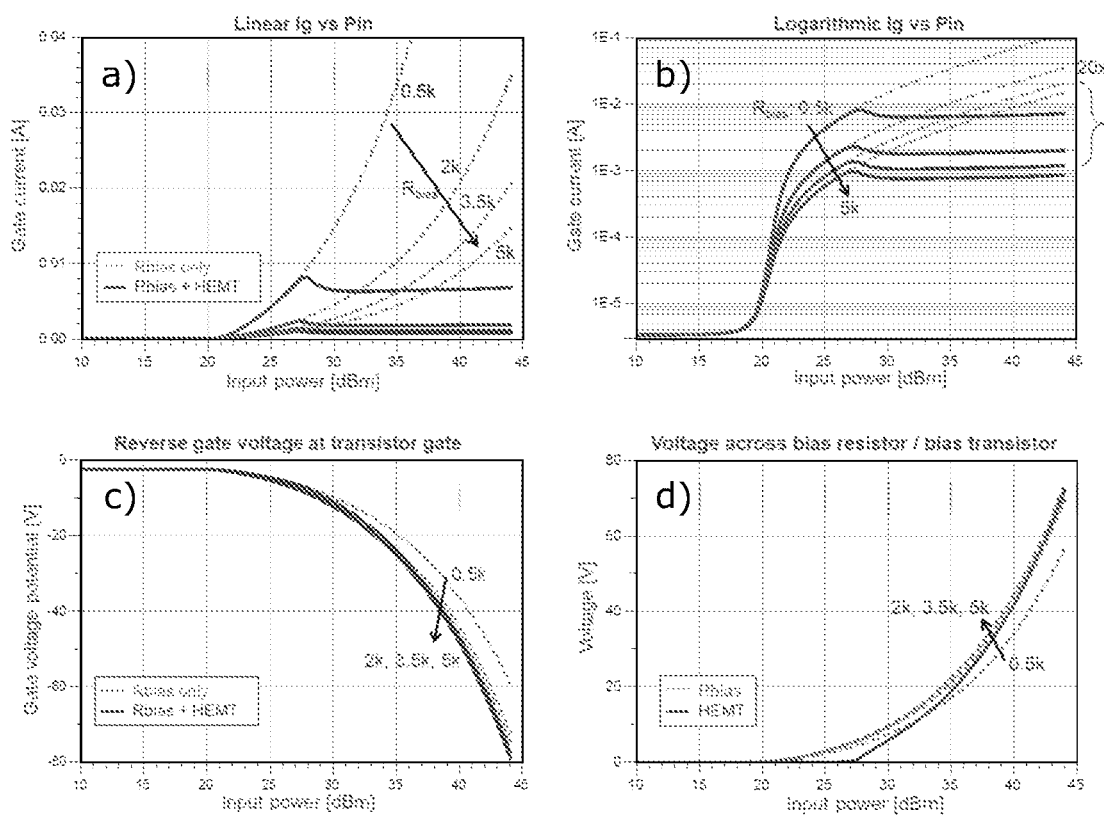

FIG. 5 shows various characteristic curves for comparing a conventional current limiter circuit and a current limiter circuit according to the invention.

Figure a) shows a linear and figure b) a logarithmically scaled comparison between the gate current (in amperes (A)) in a conventional resistor circuit for limiting the gate current according to FIG. 1 (interrupted curve) and a circuit arrangement according to the invention as shown in FIG. 3 (continuous curve), in each case as a function of the input power $P_{in}$ (in decibels milliwatts (dBm)). It can be clearly seen that in the embodiment according to the invention, extensive regulation of the gate current is made possible, whereby the maximum permissible gate current can be selected by adjusting the first resistor $R_1$.

Figures c) and d) show respectively the reverse voltage at the gate of the first FET and the voltage drop across the first resistor $R_1$ in a conventional resistor circuit for limiting the gate current according to FIG. 1 (interrupted curve) and a circuit arrangement according to the invention according to FIG. 3 (continuous curve), in each case as a function of the input power $P_{in}$ (in decibels milliwatts (dBm)). The voltage drop across the first resistor $R_1$ in the conventional circuit is no different from the voltage across the first FET ($V_{ds}$) and therefore poses no challenge for GaN technology in particular.

LIST OF REFERENCE SIGNS

10 First FET
12 Gate terminal (first FET)

20 Supply network
22 First connection
220 high resistance $R_1$
222 second FET
224 Gate terminal (second FET)
24 second connection
240 second high impedance resistor $R_2$
26 Inductance L
30 Third connection

The invention claimed is:

1. A circuit arrangement for limiting the gate current on a field effect transistor, FET, comprising a first FET and a DC supply network connected to a gate terminal of the first FET; the supply network providing a voltage $V_{gg}$ to the gate terminal of the first FET via a first connection comprising a high impedance resistor $R_1$ and a second FET connected in series therewith and having a gate terminal; the second FET having an ON state at a gate-source voltage of 0 V and having its gate terminal also connected to the gate terminal of the first FET via a second connection in parallel with the resistor $R_1$; wherein a voltage drop occurring across the resistor $R_1$ results in increasing blocking of the second FET, wherein for RF decoupling the first connection and the second connection are connected to the gate terminal of the first FET via a common inductance L.

2. The circuit arrangement according to claim 1, wherein for RF decoupling in the second connection a second high-impedance resistor $R_2$ is connected in parallel with the high-impedance resistor $R_1$.

3. The circuit arrangement according to claim 1, wherein the first FET is a GaN or GaAs RF power HEMT.

4. The circuit arrangement according to claim 1, wherein the first FET and the second FET are monolithically integrated on one chip.

5. The circuit arrangement according to claim 1, wherein the first FET and the second FET are arranged on different chips.

6. The circuit arrangement according to claim 1, wherein the supply network does not comprise diodes or Zener diodes for limiting the gate current at the first FET.

7. An amplifier circuit, comprising a circuit arrangement according to claim 1, wherein an input power $P_{in}$ to be amplified is fed into the first FET via a third connection connected to the gate terminal of the first FET.

8. An apparatus for receiving microwave signals, comprising an amplifier circuit according to claim 7.

* * * * *